(12) United States Patent
Haba et al.

(10) Patent No.: US 9,595,511 B1
(45) Date of Patent: Mar. 14, 2017

(54) MICROELECTRONIC PACKAGES AND ASSEMBLIES WITH IMPROVED FLYBY SIGNALING OPERATION

(71) Applicant: Invensas Corporation, San Jose, CA (US)

(72) Inventors: Belgacem Haba, Saratoga, CA (US); Zhuowen Sun, Campbell, CA (US); Javier A. Delacruz, Santa Clara, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/153,367

(22) Filed: May 12, 2016

(51) Int. Cl.
  *H01L 23/02* (2006.01)
  *H01L 25/10* (2006.01)
  *H01L 27/108* (2006.01)

(52) U.S. Cl.
  CPC .......... *H01L 25/105* (2013.01); *H01L 27/108* (2013.01); *H01L 2225/06517* (2013.01); *H01L 2225/06541* (2013.01); *H01L 2225/06551* (2013.01)

(58) Field of Classification Search
  CPC ................. H01L 25/105; H01L 27/108; H01L 2225/06517; H01L 2225/06541; H01L 2225/06551
  USPC ........................................................ 257/686
  See application file for complete search history.

(56) References Cited

U.S. PATENT DOCUMENTS

| 3,639,888 A | 2/1972 | Pittman et al. |
| 4,323,914 A | 4/1982 | Berndlmaier et al. |
| 4,336,551 A | 6/1982 | Fujita et al. |
| 4,363,076 A | 12/1982 | McIver |
| 4,500,905 A | 2/1985 | Shibata |

(Continued)

FOREIGN PATENT DOCUMENTS

| CN | 2512114 Y | 9/2002 |
| CN | 1531069 A | 9/2004 |

(Continued)

OTHER PUBLICATIONS

U.S. Appl. No. 14/883,864 dated Oct. 15, 2015.

(Continued)

*Primary Examiner* — Tu-Tu Ho
(74) *Attorney, Agent, or Firm* — Lerner, David, Littenberg, Krumholz & Mentlik, LLP

(57) ABSTRACT

A microelectronic unit includes microelectronic elements having memory storage arrays. First terminals and second terminals at a surface of the microelectronic unit are configured for connection with corresponding first and second sets of circuit panel contacts which are coupled with conductors of a common signaling bus on the circuit panel. Front surfaces of first and second microelectronic elements define a plurality of first planes at a substantial angle to a second plane defined by the major surface of the circuit panel. Each of a plurality of delay elements within the microelectronic unit is electrically coupled with a signaling path of the common signaling bus between one of the first terminals and a corresponding second terminal. In such way, the delay elements may reduce adverse effects of additive signal energy reflected from the microelectronic packages back towards the common signaling bus.

23 Claims, 6 Drawing Sheets

(56) References Cited

U.S. PATENT DOCUMENTS

| | | |
|---|---|---|
| 4,706,166 A | 11/1987 | Go |
| 4,726,777 A | 2/1988 | Billman et al. |
| 4,784,972 A | 11/1988 | Hatada |
| 4,951,122 A | 8/1990 | Tsubosaki et al. |
| 4,967,262 A | 10/1990 | Farnsworth |
| 5,047,837 A | 9/1991 | Kitano et al. |
| 5,107,325 A | 4/1992 | Nakayoshi |
| 5,138,438 A | 8/1992 | Masayuki et al. |
| 5,200,362 A | 4/1993 | Lin et al. |
| 5,218,234 A | 6/1993 | Thompson et al. |
| 5,304,737 A | 4/1994 | Kim |
| 5,311,401 A | 5/1994 | Gates, Jr. et al. |
| 5,331,591 A | 7/1994 | Clifton |
| 5,334,872 A | 8/1994 | Ueda et al. |
| 5,347,428 A | 9/1994 | Carson et al. |
| 5,365,106 A | 11/1994 | Watanabe |
| 5,434,745 A | 7/1995 | Shokrgozar et al. |
| 5,466,634 A | 11/1995 | Beilstein, Jr. et al. |
| 5,534,729 A | 7/1996 | Russell |
| 5,538,758 A | 7/1996 | Beach et al. |
| 5,571,754 A | 11/1996 | Bertin et al. |
| 5,592,019 A | 1/1997 | Ueda et al. |
| 5,616,953 A | 4/1997 | King et al. |
| 5,629,566 A | 5/1997 | Doi et al. |
| 5,675,180 A | 10/1997 | Pedersen et al. |
| 5,691,248 A | 11/1997 | Cronin et al. |
| 5,698,895 A | 12/1997 | Pedersen et al. |
| 5,716,759 A | 2/1998 | Badehi |
| 5,721,151 A | 2/1998 | Padmanabhan et al. |
| 5,731,631 A | 3/1998 | Yama et al. |
| 5,737,191 A | 4/1998 | Horiuchi et al. |
| 5,870,351 A | 2/1999 | Ladabaum et al. |
| 5,879,965 A | 3/1999 | Jiang et al. |
| 5,891,761 A | 4/1999 | Vindasius et al. |
| 5,910,687 A | 6/1999 | Chen et al. |
| 5,946,545 A | 8/1999 | Bertin et al. |
| 5,965,947 A | 10/1999 | Nam et al. |
| 6,030,854 A | 2/2000 | Mashimoto et al. |
| 6,034,438 A | 3/2000 | Petersen |
| 6,071,139 A | 6/2000 | Corisis et al. |
| 6,087,716 A | 7/2000 | Ikeda |
| 6,107,164 A | 8/2000 | Ohuchi |
| 6,175,158 B1 | 1/2001 | Degani et al. |
| 6,225,689 B1 | 5/2001 | Moden et al. |
| 6,228,686 B1 | 5/2001 | Smith et al. |
| 6,255,726 B1 | 7/2001 | Vindasius et al. |
| 6,262,476 B1 | 7/2001 | Vidal |
| 6,271,598 B1 | 8/2001 | Vindasius et al. |
| 6,297,657 B1 | 10/2001 | Thiessen et al. |
| 6,303,977 B1 | 10/2001 | Schroen et al. |
| 6,315,856 B1 | 11/2001 | Asagiri et al. |
| 6,326,244 B1 | 12/2001 | Brooks et al. |
| 6,326,689 B1 | 12/2001 | Thomas |
| 6,338,980 B1 | 1/2002 | Satoh |
| 6,351,030 B2 | 2/2002 | Havens et al. |
| 6,472,746 B2 | 10/2002 | Taniguchi et al. |
| 6,476,467 B2 | 11/2002 | Nakamura et al. |
| 6,566,760 B1 | 5/2003 | Kawamura et al. |
| 6,569,709 B2 | 5/2003 | Derderian |
| D475,981 S | 6/2003 | Michii |
| 6,580,165 B1 | 6/2003 | Singh |
| 6,582,992 B2 | 6/2003 | Poo et al. |
| 6,593,648 B2 | 7/2003 | Emoto |
| 6,607,938 B2 | 8/2003 | Kwon et al. |
| 6,607,941 B2 | 8/2003 | Prabhu et al. |
| 6,621,155 B1 | 9/2003 | Perino et al. |
| 6,621,172 B2 | 9/2003 | Nakayama et al. |
| 6,624,505 B2 | 9/2003 | Badehi |
| 6,656,827 B1 | 12/2003 | Tsao et al. |
| 6,667,543 B1 | 12/2003 | Chow et al. |
| 6,670,701 B2 | 12/2003 | Matsuura et al. |
| 6,674,159 B1 | 1/2004 | Peterson et al. |
| 6,686,655 B2 | 2/2004 | Moden et al. |
| 6,706,971 B2 | 3/2004 | Albert et al. |
| 6,710,246 B1 | 3/2004 | Mostafazadeh et al. |
| 6,717,061 B2 | 4/2004 | Yamaguchi et al. |
| 6,722,213 B2 | 4/2004 | Offen et al. |
| 6,730,997 B2 | 5/2004 | Beyne et al. |
| 6,737,743 B2 | 5/2004 | Urakawa |
| 6,747,348 B2 | 6/2004 | Jeung et al. |
| 6,750,547 B2 | 6/2004 | Jeung et al. |
| 6,756,252 B2 | 6/2004 | Nakanishi |
| 6,777,767 B2 | 8/2004 | Badehi |
| 6,802,446 B2 | 10/2004 | Chaudhuri et al. |
| 6,844,623 B1 | 1/2005 | Peterson et al. |
| 6,849,802 B2 | 2/2005 | Song et al. |
| 6,853,557 B1 * | 2/2005 | Haba ............... G11C 5/00 174/261 |
| 6,908,784 B1 | 6/2005 | Farnworth et al. |
| 6,910,268 B2 | 6/2005 | Miller |
| 6,940,022 B1 | 9/2005 | Vinciarelli et al. |
| 6,956,283 B1 | 10/2005 | Peterson |
| 6,964,915 B2 | 11/2005 | Farnworth et al. |
| 6,972,480 B2 | 12/2005 | Zilber et al. |
| 6,973,718 B2 | 12/2005 | Sheppard, Jr. et al. |
| 6,984,885 B1 | 1/2006 | Harada et al. |
| 7,005,324 B2 | 2/2006 | Imai |
| 7,029,949 B2 | 4/2006 | Farnworth et al. |
| 7,061,125 B2 | 6/2006 | Cho et al. |
| 7,115,986 B2 | 10/2006 | Moon et al. |
| 7,125,750 B2 | 10/2006 | Kwan et al. |
| 7,127,807 B2 | 10/2006 | Yamaguchi et al. |
| 7,180,168 B2 | 2/2007 | Imai |
| 7,190,060 B1 | 3/2007 | Chiang |
| 7,196,262 B2 | 3/2007 | Gronet |
| 7,208,335 B2 | 4/2007 | Boon et al. |
| 7,208,345 B2 | 4/2007 | Meyer et al. |
| 7,215,018 B2 | 5/2007 | Vindasius et al. |
| 7,221,051 B2 | 5/2007 | Ono et al. |
| 7,245,021 B2 | 7/2007 | Vindasius et al. |
| 7,259,455 B2 | 8/2007 | Seto |
| 7,279,363 B2 | 10/2007 | Cherukuri et al. |
| 7,285,865 B2 | 10/2007 | Kwon et al. |
| 7,335,533 B2 | 2/2008 | Derderian |
| 7,344,917 B2 | 3/2008 | Gautham |
| 7,355,274 B2 | 4/2008 | Lim |
| 7,405,138 B2 | 7/2008 | Ohuchi et al. |
| 7,408,243 B2 | 8/2008 | Shiffer |
| 7,429,782 B2 | 9/2008 | Brunnbauer et al. |
| 7,452,743 B2 | 11/2008 | Oliver et al. |
| 7,514,350 B2 | 4/2009 | Hashimoto |
| 7,521,288 B2 | 4/2009 | Arai et al. |
| 7,535,109 B2 | 5/2009 | Robinson et al. |
| 7,564,142 B2 | 7/2009 | Hashimoto |
| 7,595,222 B2 | 9/2009 | Shimoishizaka et al. |
| 7,601,039 B2 | 10/2009 | Eldridge et al. |
| 7,638,869 B2 | 12/2009 | Irsigler et al. |
| 7,662,670 B2 | 2/2010 | Noma et al. |
| 7,662,671 B2 | 2/2010 | Saeki |
| 7,704,794 B2 | 4/2010 | Mess et al. |
| 7,732,912 B2 | 6/2010 | Damberg |
| 7,768,795 B2 | 8/2010 | Sakurai et al. |
| 7,829,438 B2 | 11/2010 | Haba et al. |
| 7,863,159 B2 | 1/2011 | Co et al. |
| 7,888,185 B2 | 2/2011 | Corisis et al. |
| 7,901,989 B2 | 3/2011 | Haba et al. |
| 7,919,846 B2 | 4/2011 | Hembree |
| 7,923,349 B2 | 4/2011 | McElrea et al. |
| 7,951,649 B2 | 5/2011 | Val |
| 7,952,195 B2 | 5/2011 | Haba |
| 8,022,527 B2 | 9/2011 | Haba et al. |
| 8,076,788 B2 | 12/2011 | Haba et al. |
| 8,178,978 B2 | 5/2012 | McElrea et al. |
| 8,373,280 B2 | 2/2013 | Harada et al. |
| 8,390,109 B2 | 3/2013 | Popovic et al. |
| 8,431,435 B2 | 4/2013 | Haba et al. |
| 8,551,815 B2 | 10/2013 | Avsian et al. |
| 8,618,659 B2 | 12/2013 | Sato et al. |
| 8,619,659 B2 | 12/2013 | Lee et al. |
| 8,629,543 B2 | 1/2014 | McElrea et al. |
| 8,633,576 B2 | 1/2014 | Zohni et al. |
| 8,674,482 B2 | 3/2014 | Shi et al. |
| 8,704,379 B2 | 4/2014 | Crane et al. |
| 8,723,332 B2 | 5/2014 | McElrea et al. |

(56) References Cited

U.S. PATENT DOCUMENTS

| | | |
|---|---|---|
| 9,123,418 B2 | 9/2015 | Lin et al. |
| 9,136,251 B2 | 9/2015 | Cheah et al. |
| 2001/0012725 A1 | 8/2001 | Maeda et al. |
| 2001/0031548 A1 | 10/2001 | Elenius et al. |
| 2002/0006686 A1 | 1/2002 | Cloud et al. |
| 2002/0027257 A1 | 3/2002 | Kinsman et al. |
| 2002/0045290 A1 | 4/2002 | Ball |
| 2002/0096349 A1 | 7/2002 | Hedler et al. |
| 2002/0127775 A1 | 9/2002 | Haba et al. |
| 2002/0168798 A1 | 11/2002 | Glenn et al. |
| 2002/0180010 A1 | 12/2002 | Tsubosaki et al. |
| 2002/0185725 A1 | 12/2002 | Moden et al. |
| 2002/0187260 A1 | 12/2002 | Sheppard et al. |
| 2002/0190368 A1 | 12/2002 | Shimoe et al. |
| 2003/0038353 A1 | 2/2003 | Derderian |
| 2003/0038356 A1 | 2/2003 | Derderian |
| 2003/0038357 A1 | 2/2003 | Derderian |
| 2003/0060034 A1 | 3/2003 | Beyne et al. |
| 2003/0071338 A1 | 4/2003 | Jeung et al. |
| 2003/0071341 A1 | 4/2003 | Jeung et al. |
| 2003/0080403 A1 | 5/2003 | Jeung et al. |
| 2003/0092326 A1 | 5/2003 | Nishikawa et al. |
| 2003/0096454 A1 | 5/2003 | Poo et al. |
| 2003/0099085 A1 | 5/2003 | Duva |
| 2003/0122243 A1 | 7/2003 | Lee et al. |
| 2003/0143819 A1 | 7/2003 | Hedler et al. |
| 2003/0148597 A1 | 8/2003 | Tan et al. |
| 2003/0162369 A1 | 8/2003 | Kobayashi |
| 2003/0209772 A1 | 11/2003 | Prabhu |
| 2004/0113283 A1 | 6/2004 | Farnworth et al. |
| 2004/0142509 A1 | 7/2004 | Imai |
| 2004/0150095 A1 | 8/2004 | Fraley et al. |
| 2004/0173892 A1 | 9/2004 | Nakanishi |
| 2004/0195667 A1 | 10/2004 | Karnezos |
| 2004/0198033 A1 | 10/2004 | Lee et al. |
| 2004/0212083 A1 | 10/2004 | Yang |
| 2004/0217446 A1 | 11/2004 | Headley et al. |
| 2004/0227235 A1 | 11/2004 | Hashimoto |
| 2004/0238933 A1 | 12/2004 | Chen et al. |
| 2004/0251520 A1 | 12/2004 | Sasaki et al. |
| 2004/0262035 A1 | 12/2004 | Ko et al. |
| 2005/0013927 A1 | 1/2005 | Yamazaki |
| 2005/0067680 A1 | 3/2005 | Boon et al. |
| 2005/0067694 A1 | 3/2005 | Pon et al. |
| 2005/0082651 A1 | 4/2005 | Farnworth et al. |
| 2005/0085050 A1 | 4/2005 | Draney et al. |
| 2005/0101039 A1 | 5/2005 | Chen et al. |
| 2005/0104179 A1 | 5/2005 | Zilber et al. |
| 2005/0148160 A1 | 7/2005 | Farnworth et al. |
| 2005/0156323 A1 | 7/2005 | Tokunaga |
| 2005/0230802 A1 | 10/2005 | Vindasius et al. |
| 2005/0248021 A1 | 11/2005 | Morkner |
| 2005/0258530 A1 | 11/2005 | Vindasius et al. |
| 2005/0287705 A1 | 12/2005 | Yang |
| 2005/0287709 A1 | 12/2005 | Lee et al. |
| 2006/0003552 A1 | 1/2006 | Okada |
| 2006/0035408 A1 | 2/2006 | Derderian |
| 2006/0046436 A1 | 3/2006 | Ohuchi et al. |
| 2006/0055050 A1 | 3/2006 | Numata et al. |
| 2006/0068567 A1 | 3/2006 | Beyne et al. |
| 2006/0076690 A1 | 4/2006 | Khandros et al. |
| 2006/0094165 A1 | 5/2006 | Hedler et al. |
| 2006/0097356 A1 | 5/2006 | Fujii et al. |
| 2006/0103000 A1 | 5/2006 | Kurosawa |
| 2006/0121645 A1 | 6/2006 | Ball |
| 2006/0138626 A1 | 6/2006 | Liew et al. |
| 2006/0220262 A1 | 10/2006 | Meyer et al. |
| 2006/0252180 A1 | 11/2006 | Moden et al. |
| 2006/0267173 A1 | 11/2006 | Takiar et al. |
| 2006/0273365 A1 | 12/2006 | Cross et al. |
| 2006/0278971 A1 | 12/2006 | Barnes et al. |
| 2007/0023900 A1 | 2/2007 | Toyoda |
| 2007/0029684 A1 | 2/2007 | Arai et al. |
| 2007/0065987 A1 | 3/2007 | Mess et al. |
| 2007/0102801 A1 | 5/2007 | Ishida et al. |
| 2007/0132082 A1 | 6/2007 | Tang et al. |
| 2007/0158799 A1 | 7/2007 | Chiu et al. |
| 2007/0158807 A1 | 7/2007 | Lu et al. |
| 2007/0170572 A1 | 7/2007 | Liu et al. |
| 2007/0181989 A1 | 8/2007 | Corisis et al. |
| 2007/0187811 A1 | 8/2007 | Arai et al. |
| 2007/0194462 A1 | 8/2007 | Kim et al. |
| 2007/0222054 A1 | 9/2007 | Hembree |
| 2007/0252262 A1 | 11/2007 | Robinson et al. |
| 2007/0284716 A1 | 12/2007 | Vindasius et al. |
| 2008/0029866 A1 | 2/2008 | Kim et al. |
| 2008/0083976 A1 | 4/2008 | Haba et al. |
| 2008/0083977 A1 | 4/2008 | Haba et al. |
| 2008/0112150 A1 | 5/2008 | Jones |
| 2008/0150158 A1 | 6/2008 | Chin |
| 2008/0166836 A1 | 7/2008 | Jobetto |
| 2008/0173792 A1 | 7/2008 | Yang et al. |
| 2008/0180242 A1 | 7/2008 | Cottingham |
| 2008/0203566 A1 | 8/2008 | Su |
| 2008/0206915 A1 | 8/2008 | Yamazaki |
| 2008/0208043 A1 | 8/2008 | Smith et al. |
| 2008/0251913 A1 | 10/2008 | Inomata |
| 2008/0251939 A1 | 10/2008 | Chung et al. |
| 2008/0284044 A1 | 11/2008 | Myers |
| 2008/0290493 A1 | 11/2008 | Tsunozaki |
| 2008/0303131 A1 | 12/2008 | McElrea et al. |
| 2008/0308921 A1 | 12/2008 | Kim |
| 2008/0315407 A1 | 12/2008 | Andrews, Jr. et al. |
| 2009/0020887 A1 | 1/2009 | Mizuno et al. |
| 2009/0020889 A1 | 1/2009 | Murayama et al. |
| 2009/0045524 A1 | 2/2009 | Mohammed et al. |
| 2009/0065948 A1 | 3/2009 | Wang |
| 2009/0068790 A1 | 3/2009 | Caskey et al. |
| 2009/0102038 A1 | 4/2009 | McElrea et al. |
| 2009/0146137 A1 | 6/2009 | Kim et al. |
| 2009/0160065 A1 | 6/2009 | Haba et al. |
| 2009/0230528 A1 | 9/2009 | McElrea et al. |
| 2009/0316378 A1 | 12/2009 | Haba et al. |
| 2010/0140753 A1 | 6/2010 | Hembree |
| 2010/0140811 A1 | 6/2010 | Leal et al. |
| 2010/0148352 A1 | 6/2010 | Moden |
| 2010/0207277 A1 | 8/2010 | Bauer et al. |
| 2010/0327461 A1 | 12/2010 | Co et al. |
| 2011/0006432 A1 | 1/2011 | Haba et al. |
| 2011/0031629 A1 | 2/2011 | Haba et al. |
| 2011/0033979 A1 | 2/2011 | Haba et al. |
| 2011/0049696 A1 | 3/2011 | Haba et al. |
| 2011/0187007 A1 | 8/2011 | Haba et al. |
| 2011/0248410 A1 | 10/2011 | Avsian et al. |
| 2011/0266684 A1 | 11/2011 | Leal |
| 2012/0061846 A1 | 3/2012 | Rathburn |
| 2012/0080807 A1 | 4/2012 | Haba et al. |
| 2012/0133057 A1 | 5/2012 | Haba et al. |
| 2012/0211878 A1 | 8/2012 | Popovic et al. |
| 2013/0083583 A1 | 4/2013 | Crisp et al. |
| 2013/0099392 A1 | 4/2013 | McElrea et al. |
| 2013/0119542 A1 | 5/2013 | Oh |
| 2013/0154117 A1 | 6/2013 | Tan et al. |
| 2013/0286707 A1 | 10/2013 | Crisp et al. |
| 2014/0264945 A1 | 9/2014 | Yap et al. |

FOREIGN PATENT DOCUMENTS

| | | |
|---|---|---|
| CN | 1638118 A | 7/2005 |
| CN | 1905148 A | 1/2007 |
| CN | 104332462 A | 2/2015 |
| DE | 102004039906 A1 | 8/2005 |
| EP | 1041624 A1 | 10/2000 |
| EP | 1763894 A2 | 3/2007 |
| EP | 2650880 A1 | 10/2013 |
| FR | 2704690 A1 | 11/1994 |
| JP | 07-509104 A | 10/1995 |
| JP | 11-260851 A | 9/1999 |
| JP | 2000269411 A | 9/2000 |
| JP | 2001210782 A | 8/2001 |
| JP | 2003-142518 A | 5/2003 |
| JP | 2003163324 A | 6/2003 |
| JP | 2004047702 A | 2/2004 |
| JP | 2004-119473 | 4/2004 |

(56) References Cited

FOREIGN PATENT DOCUMENTS

| | | |
|---|---|---|
| JP | 2004153130 A | 5/2004 |
| JP | 2004158536 A | 6/2004 |
| JP | 2004-214548 A | 7/2004 |
| JP | 2005005529 A | 1/2005 |
| JP | 2005026564 A | 1/2005 |
| JP | 2006-351793 A | 12/2006 |
| JP | 2007073803 A | 3/2007 |
| JP | 2007523482 A | 8/2007 |
| JP | 2008160119 A | 7/2008 |
| JP | 2008205453 A | 9/2008 |
| JP | 2008236688 A | 10/2008 |
| JP | 2009-026969 | 2/2009 |
| JP | 2009027039 A | 2/2009 |
| KR | 20-1994-0004952 | 7/1994 |
| KR | 10-1999-0008537 | 2/1999 |
| KR | 20010062722 A | 7/2001 |
| KR | 20050009036 A | 1/2005 |
| KR | 20070018057 A | 2/2007 |
| KR | 100813624 B1 | 3/2008 |
| KR | 20080045259 A | 5/2008 |
| KR | 20080069549 A | 7/2008 |
| KR | 20080091980 | 10/2008 |
| TW | 475244 | 2/2002 |
| TW | 200425356 A | 11/2004 |
| TW | 200504995 A | 2/2005 |
| TW | 200527549 A | 8/2005 |
| TW | 200605298 A | 2/2006 |
| TW | 200721471 | 6/2007 |
| TW | 200913208 A | 3/2009 |
| TW | 200940570 A | 10/2009 |
| WO | 9425987 A1 | 11/1994 |
| WO | 9907015 A1 | 2/1999 |
| WO | 9909599 A2 | 2/1999 |
| WO | 0164344 A2 | 9/2001 |
| WO | 2005081315 A2 | 9/2005 |
| WO | 2005101492 A2 | 10/2005 |
| WO | 2009032371 A1 | 3/2009 |
| WO | 2009052150 A1 | 4/2009 |
| WO | 2009114670 A2 | 9/2009 |
| WO | 2010057339 A1 | 5/2010 |

OTHER PUBLICATIONS

Cheah, Bok Eng, et al., Modeling and Electrical Characteristics Evaluation of Vertical Side-Chip Internconnection or Compact 3D Integration, School of Electrical and Electronic Engineering, Universiti Sains Malaysia, 13th Electronics Materials and Packaging (EMAP), Nov. 2011.

Han, Sang Wook, Wireless Interconnect using Inductive Coupling in 3D-ICs, University of Michigan, 2012.

Kong, J., et al., Sensitivity Study of Channel Termination on Vertical Side-Chip Interconnection, Universiti Sains Malaysia, 35th International Electronic Manufacturing Technology Conference, 2012.

* cited by examiner

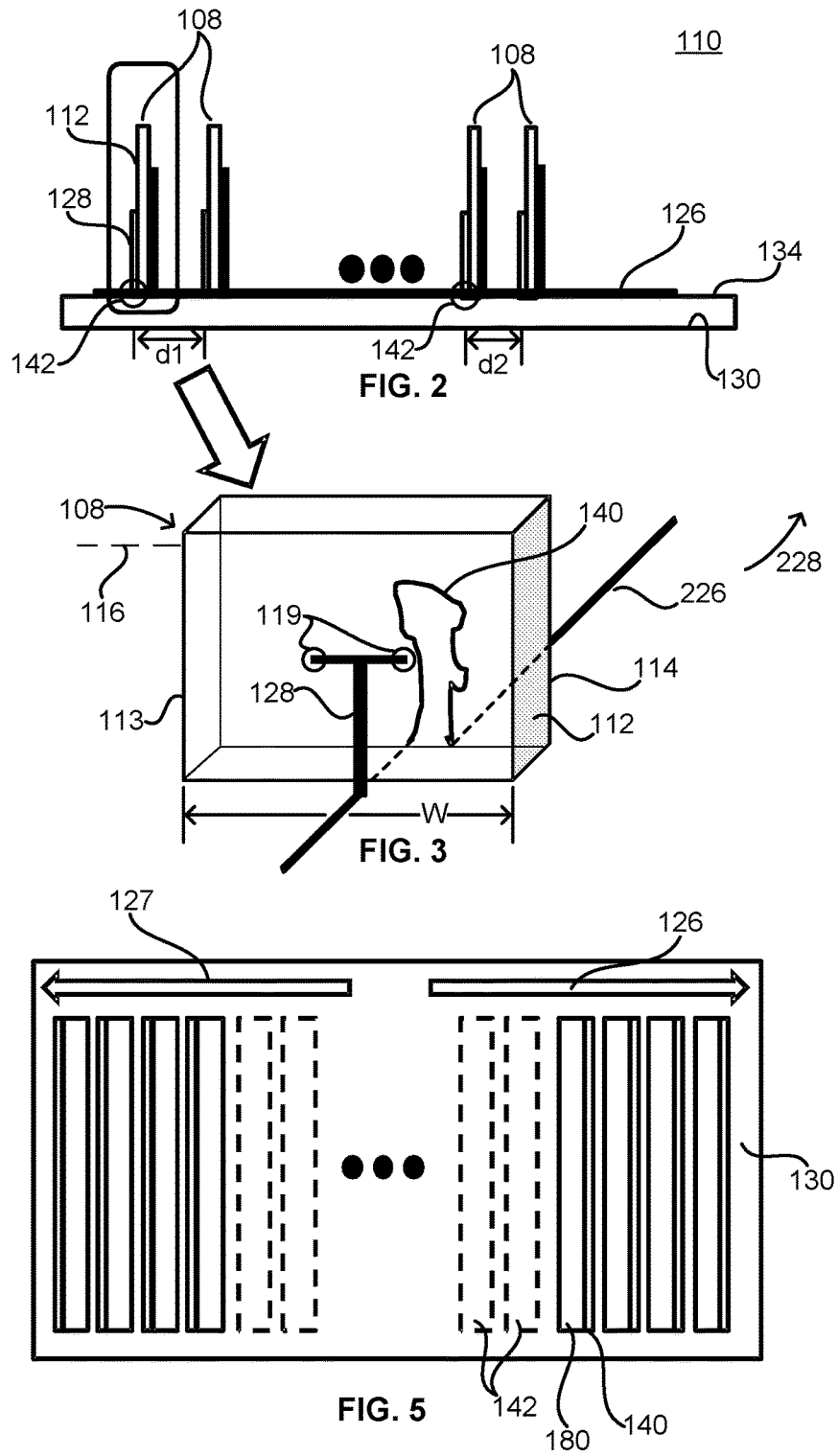

MICROELECTRONIC PACKAGES AND
ASSEMBLIES WITH IMPROVED FLYBY
SIGNALING OPERATION

BACKGROUND

Technical Field

The subject matter of this application relates to microelectronic packages and assemblies in which a plurality of microelectronic elements, e.g., semiconductor chips are arranged in a stacked relation with one another, and may be coupled to an underlying circuit panel, and more specifically to such assemblies having memory storage array chips which may be in a flyby signaling arrangement with one another.

Description of the Related Art

Semiconductor die or chips are flat bodies with contacts of the chip disposed on their front surfaces which are connected to the internal electrical circuitry including active devices of the chip itself. Semiconductor chips are typically packaged with substrates to form microelectronic packages having terminals that are electrically connected to the chip contacts. The package may then be connected to test equipment to determine whether the packaged device conforms to a desired performance standard. Once tested, the package may be connected to a larger circuit, e.g., a circuit in an electronic product such as a computer, e.g., server or user computer, or a mobile device such as a smartphone or tablet, for example.

In order to save space certain conventional designs have stacked multiple microelectronic elements or semiconductor chips within a package. This allows the package to occupy a surface area on a substrate that is less than the total surface area of the chips in the stack. However, conventional stacked packages have disadvantages of complexity, cost, thickness and testability and area of an underlying board occupied thereby.

In spite of the above advances, there remains a need for improved stacked packages and especially stacked chip packages and stacked chip assemblies which incorporate a plurality of chips for types of memory such as, for example, dynamic random access memory (DRAM) or flash memory.

BRIEF DESCRIPTION OF THE SEVERAL VIEWS OF THE DRAWINGS

FIG. 2 is a side elevational view depicting a microelectronic unit in accordance with an embodiment disclosed herein.

FIG. 3 is a perspective view further illustrating a portion of the microelectronic unit depicted in FIG. 2.

FIG. 5 is a top-down view of a microelectronic unit in accordance with an embodiment disclosed herein.

DETAILED DESCRIPTION

Figure 1:
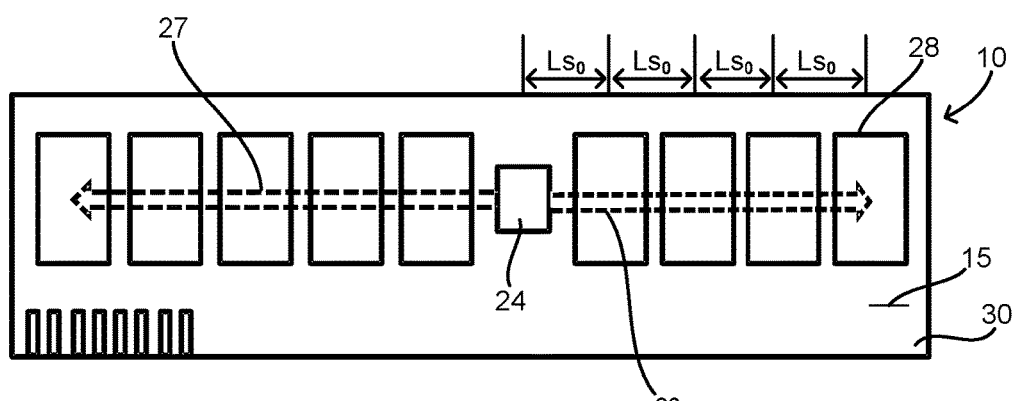
FIG. 1 is a top-down view depicting a dual inline memory module in accordance with the prior art.

A microelectronic unit includes microelectronic elements which have memory storage arrays and have surfaces with element contacts thereat. First terminals and second terminals at a surface of the microelectronic unit are configured for connection with corresponding first and second sets of circuit panel contacts, and are available for connection with a common signaling bus having conductors on the circuit panel. Front surfaces of first and second microelectronic elements define a plurality of first planes which are nonparallel with a second plane defined by the major surface of the circuit panel. Each of a plurality of delay elements may be electrically coupled with a signaling path of the common signaling bus extending between one of the first terminals and a corresponding second terminal, the signaling path coupled to a contact of at least one microelectronic element, each delay element increasing a total electrical length along the signaling path between first and second corresponding terminals.

A microelectronic assembly may include such microelectronic unit and the circuit panel, wherein the first terminals and second terminals are connected to the first panel contacts and second panel contacts, respectively.

In support of the aforementioned goals of increasing data bandwidth and speed, and to some extent, reducing size, multiple microelectronic elements such as semiconductor chips can be assembled together in one common microelectronic assembly. However, particular challenges are emerging with increased operating speeds and data transfer rates where loading onto common signaling buses such as a command-address bus can affect the signaling speed and thereby impact system performance. Embodiments in accordance with the present disclosure can help to reduce loading onto a common signaling bus such as an address bus or command-address bus. In accordance with embodiments disclosed herein, total electrical lengths between connection regions along a common signaling bus such as an address bus or command-address bus in a flyby arrangement at which microelectronic elements in the assembly are coupled can be made sufficiently long. Alternatively or in addition thereto, the total electrical lengths along the signaling paths between adjacent connection regions can be standardized relative to one another. In this way, adverse effects on the quality of signals carried by the bus due to loading resulting from the increased number of connections to the bus can be reduced.

As used herein, a statement that two or more electrically conductive features are "electrically connected," "coupled," "electrically coupled" or have an "electrical connection," or the like, unless otherwise qualified, shall mean the two features are electrically coupled to permit a flow of alternating electric current ("AC current") between the two features, and possibly to permit a flow of direct current ("DC current") between the two features, whether or not there is a direct physical connection shared by the two features.

A conventional DIMM module 10 (FIG. 1) can be arranged to provide access to one 64-bit or one 72-bit memory channel. A 64-bit memory channel is common in systems which do not provide an error correction code ("ECC") function for bits stored and retrieved from the memory storage array, while a 72-bit memory channel is common in systems which do provide such capability. A DIMM module includes a module circuit panel 30 in form of a card or board, with a set of surface mount technology ("SMT") microelectronic packages 28 mounted and electrically connected thereto, each package 28 containing one or more DRAM microelectronic elements or chips (not shown) which have memory storage arrays thereon. The area available on a front side 15 and a rear side of the module card opposite therefrom constrains the number of packages which can be mounted to the card, typically to a maximum number such as sixteen or eighteen microelectronic packages which are spread over the areas of the front and rear sides. As commonly provided in a "×4" or "by four" arrangement where each DRAM memory chip on the DIMM contributes four bits to the 64-bit or 72-bit memory channel, the maximum memory storage array capacity of the DIMM is single channel, single rank access, i.e., a "1R×4" DIMM, since the area of the front and rear sides of the DIMM module card only has space for sixteen or eighteen individual DRAM chip packages, which is equal to the minimum number of chips required to provide a 64-bit or 72-bit memory channel.

In microelectronic assemblies disclosed herein, a large number of microelectronic elements can be utilized in tandem to provide access to a large amount of memory storage array access in a relatively compact space. Each microelectronic element contains one or more memory storage arrays which may be configured to provide read and/or write access to locations therein, and may be a type of microelectronic element in which memory storage array function is a primary function thereof. In one example, each microelectronic element can be a bare semiconductor chip having chip contacts at a face of the semiconductor chip which serve as element contacts of the microelectronic element. Particular examples of such semiconductor chips are those designated as dynamic random access memory ("DRAM") chips, and those which contain DRAM devices which provide memory storage array function as an element therein. Common examples of such memory chips are those which conform to a JEDEC specification for double-data rate ("DDR") version 3, version 4, and preceding and follow-on generations, and those which conform to a JEDEC specification for low-power double-data rate ("LPDDR") version 3 (hereinafter, "LPDDRx") and preceding and follow-on generations, graphics double-data rate ("GDDRx") and preceding and follow-on generations. In another example, a microelectronic element can include one or more such semiconductor chips and additional electrical wiring elements at a face of the microelectronic element which extend to the contacts at the face of the semiconductor chip.

As applied to a specific type of memory such as dynamic random access memory ("DRAM"), principles of the embodiments disclosed herein can provide enhanced memory storage array access capable of operation at higher transfer rates (shorter machine cycles) consistent with current and historical usages of DRAM. Thus, while the available surface area on a card, board or other circuit panel utilized in a conventional memory storage array module such as a dual inline memory module ("DIMM") limits the number of DRAM chip packages which can be mounted to the module card to a maximum of sixteen or eighteen packages, the number of DRAM chip packages can be accommodated on a DIMM card as disclosed herein can be greatly increased by orienting such packages at an angle to the surface of the module card and electrically connecting the packages with the module through contacts at peripheral surfaces of the packages.

One challenge associated with increasing the number of DRAM microelectronic elements which can be accessed in the area available on the circuit panel, e.g., module card, relates to altered loading of a command address bus on the circuit panel. By way of background, as further seen in the conventional DRAM module 10 in FIG. 1, command address buses 26 and 27 supply command and address bus information to individual DRAM packages 28 which are distributed across the front and rear sides of the module card 30. In the example shown, the DIMM module includes a registered clock driver ("RCD") and the command address buses 26, 27 are illustrated in a "flyby" arrangement in which the command and address bus information is distributed sequentially from the RCD 24 to the DRAM chip packages which are arranged to receive that information at connection regions provided at controlled spacings which are integral numbers of unitized total electrical lengths $Ls_0$ from the RCD 24. In one example, each controlled spacing may be 12-14 millimeters ("mm") for example, which is somewhat larger than the width of each DRAM chip package 28 in a direction parallel to the buses 26, 27. Thus, the microelectronic element in each DRAM chip package 28 has connections to one of the command address buses 26, 27 on the module card at connection regions which occur at each of a number of integral units $Ls_0$ of total electrical lengths along the respective bus 26 or 27.

In the embodiment disclosed herein per the schematic view seen in FIG. 2, a microelectronic assembly 110 comprises a plurality of microelectronic packages mounted and electrically connected with a common circuit panel 130 or board, which can be a DRAM module card, for example. A plane defined by the front surface of a DRAM microelectronic element or "DRAM chip" in each DRAM chip package 108 is oriented at a substantial angle to the surface 134 of the circuit panel 130. The angle can be a right angle as seen in FIG. 2, or can be such as disclosed in various examples set forth in U.S. patent application Ser. No. 14/883,864, 62/219,015 and 62/194,051, the disclosures of which are incorporated herein by reference. Because of this angled relationship and connections between the microelectronic packages and the circuit panel, a greater number of microelectronic elements can be incorporated in the microelectronic assembly 110 than in the conventional 1R×4 DIMM described above with reference to FIG. 1. For example, without changing the number of bits (four) accessed from each DRAM chip in the microelectronic assembly, the increased number of DRAM chips in the assembly allows the number of ranks of the 64-bit or 72-bit memory channel in one example to be increased in the "by four" or "×4" assembly to an integral even number such as two ranks, four ranks, six ranks or eight ranks of memory channel access. In one example, in a "by four" assembly, the microelectronic assembly can accommodate four times as many DRAM chips therein as the conventional DIMM module of FIG. 1 and thereby provide four ranks. Stated another way, a DIMM module or other module constructed with these features is a "4R×4" DIMM.

Figure 4:
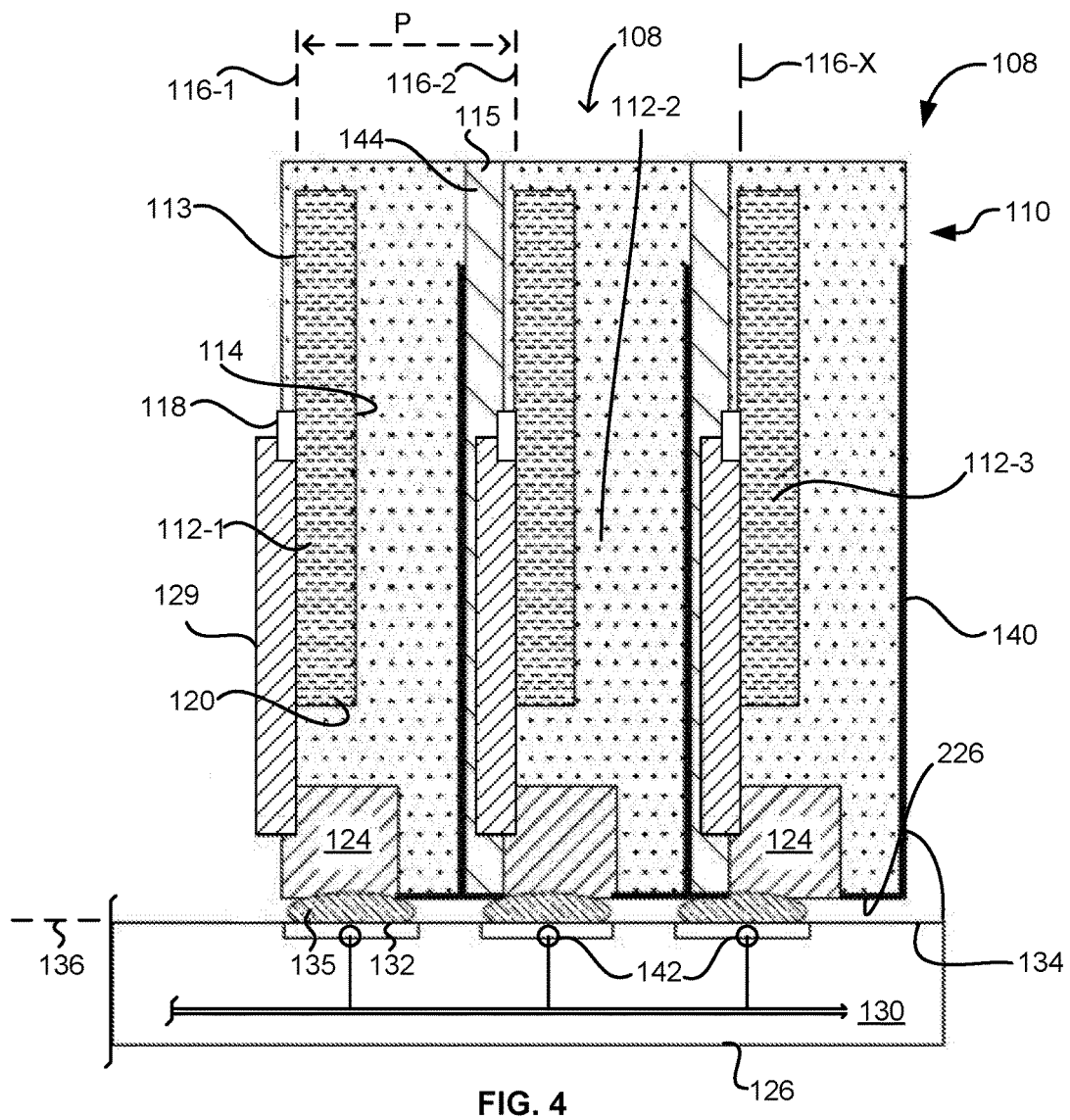
FIG. 4 is a sectional view illustrating further details of a microelectronic unit in accordance with an embodiment disclosed herein.

With the increased number of DRAM chips, the command-address bus is subject to altered loading relative to the conventional DIMM due to increased numbers of electrical conductors which extend upward from conductive elements 126 on the circuit panel 130 to the connection points at the contacts of the DRAM chips. FIGS. 2 and 3 illustrate stubs 128 which extend away from the circuit panel conductors which are configured to carry address information or command-address bus information. The stubs 128 extend from connection regions 142 to connection points 119 which connect to the contacts of each microelectronic element or chip 112 of a microelectronic package 108. In addition, as seen in FIG. 2, the distances $d_1$, $d_2$, along the circuit panel conductors 126 between adjacent connection regions at which the stubs 128 extend to individual microelectronic packages 108 may be different than, or for example, shorter than the unit $Ls_0$ of total electrical lengths disposed between adjacent connection regions in the conventional DRAM module of FIG. 1. Referring to FIG. 4, when the distances $d_1$, $d_2$, between the adjacent connection regions are the same, the distance $d_1$ can be considered equal or comparable to a pitch P between adjacent planes 116 defined by front surfaces of the microelectronic elements, respectively. In an embodiment as seen in FIGS. 2-5, the pitch P may be smaller than a width dimension W of a microelectronic package 108 in a direction parallel to a plane 116 defined by a front surface 113 of the microelectronic element 112 thereof.

Alternatively, the distances $d_1$, $d_2$, between the adjacent connection regions to the circuit panel conductors 126 may vary depending upon the size of a particular microelectronic package, presence of other elements such as heat spreaders, shields, conductive planes, buffers, etc., which may be interposed between packages. Further, variations in the design and tolerances of the circuit panel or microelectronic packages can introduce other possible variations in the distances, which in turn affect the total electrical lengths between connection regions at which each package connects to the bus. These differences, if not addressed, can lead to adverse loading effects coupled onto the common signaling bus, which in turn, can limit the frequency and/or the bandwidth at which the microelectronic assembly can be constructed or operated. In one example, the adverse loading effects can be manifested as additive reflections that are coupled onto each of a plurality of signal paths of the signal-carrying bus of the circuit panel from each of a plurality of microelectronic elements or microelectronic packages.

As further seen in FIG. 3, an embodiment is disclosed which may help address this loading of the signaling bus. As further seen in FIG. 3, a microelectronic unit includes a plurality of microelectronic packages 108, wherein delay elements 140 on one or more of the microelectronic packages are inserted into the signaling paths along a common flyby signaling bus as a way to address the above-noted differences in the loading of the flyby signaling bus caused by the arrangement of microelectronic elements in the packages relative to the circuit panel. As used herein in connection with a microelectronic package, circuit panel, supplementary element, or other structure on which conductive elements can be disposed, "on" shall mean supported by the microelectronic package, for example, "at" a surface of the package in accordance with the above-provided definition, or at an internal location within the package.

The delay elements 140 assist in lengthening and/or standardizing the total electrical lengths of the signaling paths along the signaling bus between adjacent connection regions 142 at which each package 108 (including the stubs 128 therein) is electrically coupled with the bus. In one example, the delay elements 140 on each of a plurality of the packages which are coupled in a signal path for carrying a particular signal of the bus can operate to stagger the reflections coupled onto that signal path of the bus from the microelectronic packages coupled thereto. In such way, the magnitude of the energy in voltage or current (or both) that is reflected onto that signal path can be advantageously reduced. In one example, the reduction in reflected energy as made possible by the delay elements within the assembly can reduce the adverse signal loading effects within a predetermined tolerance therefor.

A delay element 140 on the microelectronic package 108 is inserted into each conductive path of the signaling bus which is configured to carry an address, command, clock or other signal. Each conductive path may be unmultiplexed for carrying one specific signal, or may in one example be multiplexed relative to rising and falling edges of a related clock signal for carrying more than one such signal on the same conductive path.

In a particular example, each delay element 140 can be constructed as one or more electrical conductors which are coupled in a series with other elements of a signaling path 226 of the bus. Signaling paths 226 can include electrically conductive elements disposed in or on a module card, the microelectronic package or microelectronic elements therein, a motherboard, or a combination of the same. The delay elements 140 shown in FIG. 3 may extend in directions parallel to a plane defined by a rear surface 114 of a microelectronic element in the assembly 110. In the example shown in FIG. 3, a delay element 140 is constructed of one or more traces which extend in a direction parallel to and insulated from other conductive or semiconductive features of a microelectronic element 112 of a microelectronic package 108. The traces may define a delay element which adds significant capacitance, inductance, or both capacitance and inductance to the particular signaling path 226 to which the delay element is coupled of the common signal bus. In another example, in addition to traces, specific distributed and/or discrete delay-inducing elements can be inserted in the signaling paths 226 of the bus.

FIG. 4 illustrates a microelectronic assembly in accordance with a particular embodiment in which each microelectronic element 112 is arranged in an individual microelectronic package 108 which has a set of package contacts 124 thereon. Each microelectronic package 108, in turn, is electrically coupled through its package contacts 124 to corresponding panel contacts 132 at a surface 134 of a circuit panel 130. As used in this disclosure with reference to a dielectric region or dielectric structure of a component such as a circuit panel, substrate, microelectronic element or microelectronic package or other such component having dielectric structure at a surface thereof, a statement that an electrically conductive element is "at" a surface of the dielectric region or structure of the component indicates that, when the surface is not covered or assembled with any other element, the electrically conductive element is available for contact with a theoretical point moving in a direction perpendicular to that surface of the dielectric region from outside the dielectric region or component. Thus, a terminal, contact, or other conductive element which is at a surface of a dielectric region may project from such surface; may be flush with such surface; or may be recessed relative to such surface in a hole or depression in the dielectric region.

In the example shown in FIG. 4, each of three packages 108 are shown, each having package contacts 124 electrically coupled to corresponding panel contacts 132 134 of the circuit panel, such as through electrically conductive masses 135. A plurality of such packages can be assembled together with the circuit panel 130 to form a microelectronic assembly 110. As further seen in FIG. 4, the front surface 113 of each microelectronic element defines a plane 116-$x$, e.g., 116-1, 116-2, etc., the planes 116-$x$ being parallel to one another within the assembly. The planes 116-$x$ are oriented at an angle relative to a plane 136 defined by the surface 134 of the circuit panel which faces the microelectronic elements, such that planes 116-$x$ are disposed at a substantial angle relative to the plane 136 defined by the major surface 134 of the circuit panel. Thus, in one example, the angle may be greater than or equal to 20 degrees. In another example, the angle is greater than or equal to 45 degrees. In yet another example, the angle can be from 70 degrees to 90 degrees.

As shown in the example microelectronic assembly of FIG. 4, traces 129 or other conductive paths extend from package contacts 124 parallel to and along front surfaces 113 of memory storage array containing microelectronic elements which are electrically coupled to contacts 118 at the front surfaces 113. Those of the traces or other conductive paths which are coupled through the package contacts 124 to the circuit panel conductors 126 represent the stubs described above relative to FIG. 2. An insulating layer 115, which may be an adhesive or other polymeric material or other insulating material, can be disposed between adjacent microelectronic elements 112-1, 112-2, 112-3 within the assembly.

In FIG. 4, delay elements 140 are illustratively provided which extend in directions along a rear insulating surface 144 of a microelectronic package 108, the rear insulating surface 144 typically being parallel to a rear surface 114 of a microelectronic element 112-1 within the package. The delay elements 140 function to lengthen and/or standardize the total electrical lengths of the signaling paths 226 which carry bus signals between adjacent connection regions of the circuit panel 130 at which panel contacts 132 electrically couple each microelectronic package 108 to conductive elements of the bus 126 lying on the circuit panel.

In one example, the delay elements can be made by additive processing such as depositing electrically conductive material in a carrier such as electrically conductive ink, or electrically conductive polymeric composition by dispensing, stencil or screen printing. Alternatively, or in addition thereto, delay elements may be fabricated using plating processes which can comprise electroless or electrolytic plating or a combination thereof, as formed on a prior deposited seed layer which may be formed by electrolytic plating or other deposition method. In other examples, subtractive processing can be applied to a foil or other electrically conductive layer formed by prior deposition. Alternatively or in addition thereto, delay elements may include out of plane elements such as metalized vias, electrically conductive pillars or posts or bond via array elements which project in a direction parallel to or away from a plane defined by the rear insulating surface 144 of the microelectronic package 108.

FIG. 5 provides a corresponding top-down view showing the common signaling buses 126, 127, connection regions 142 and microelectronic packages 108 which extend above a major surface of the circuit panel 130, wherein delay elements 140 are disposed at the areas shown at rear insulating surfaces 144 of the packages.

Figure 6:
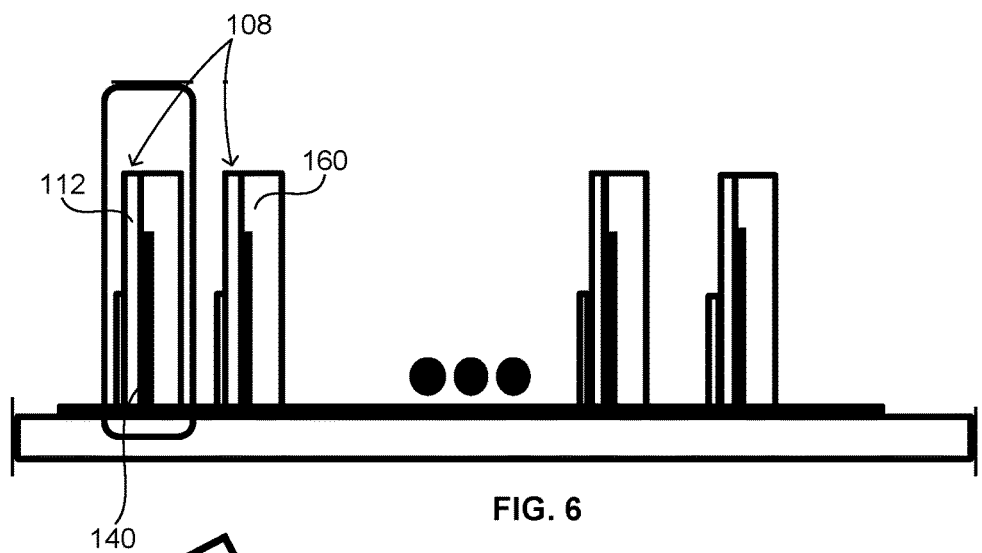
FIG. 6 is a side elevational view depicting a microelectronic unit in accordance with another embodiment disclosed herein.
Figure 7:
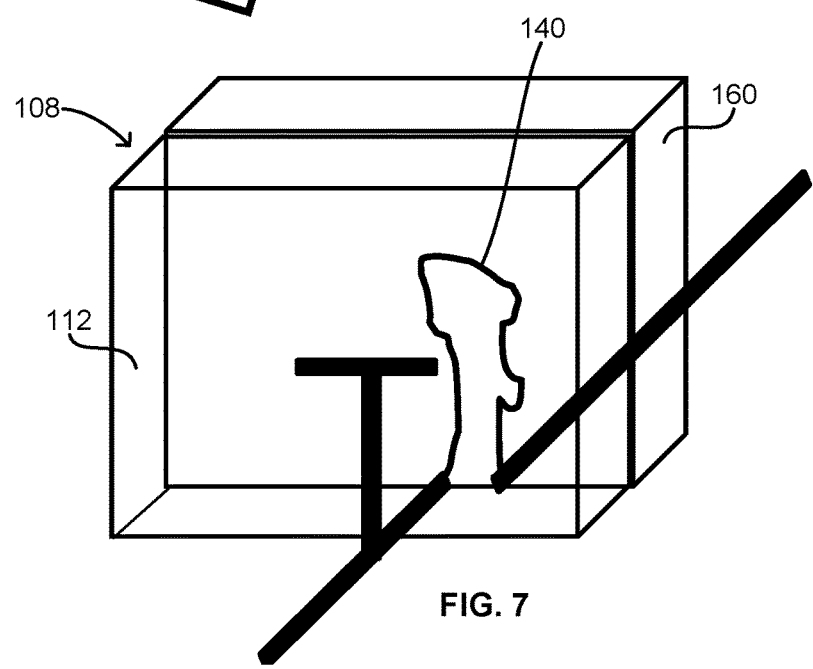
FIG. 7 is a perspective view further illustrating a portion of the microelectronic unit depicted in FIG. 6.

Referring to FIGS. 6 and 7, in a variation of the above-described embodiment, a microelectronic unit comprises microelectronic packages 108 and supplementary elements 160 disposed between adjacent microelectronic packages. Delay elements 140 are supported on a surface of the supplementary element 160 that may be attached to or otherwise disposed parallel to the planes 116-$x$ (FIG. 4) defined by the front surfaces of the microelectronic elements of the respective microelectronic packages. The supplementary element 160 can be disposed between major surfaces of microelectronic elements in at least one microelectronic package in the assembly, or can be disposed between major surfaces of microelectronic packages in the assembly. In examples, the supplementary elements can be made of a semiconductor material, glass, a molded composition such as a potting compound which includes a polymeric component, a metallic component such as a leadframe component with an insulating layer thereon, or a dielectric element comprising one or more layers of dielectric material such as epoxy, polyimide or other polymeric material, or a combination of one or more such materials. In a particular example, the supplementary element may be formed of a polymeric material which is loaded with additional insulating, semiconducting or metallic elements or particles which may act to increase stiffness and/or to reduce a Young's modulus of the resulting element.

Delay elements 140 in this variation can be made by processing identical to that described above. Electrical connections with other conductive elements of each signaling path of the bus can be provided, for example, through conductive masses 135 which connect the package contacts of each package to corresponding panel contacts 132 on the circuit panel. As seen in FIG. 4, the conductive masses 135 can bridge gaps between electrically conductive traces on a package and other associated panel contacts 132 on the circuit panel 130 therebetween.

Figure 8:
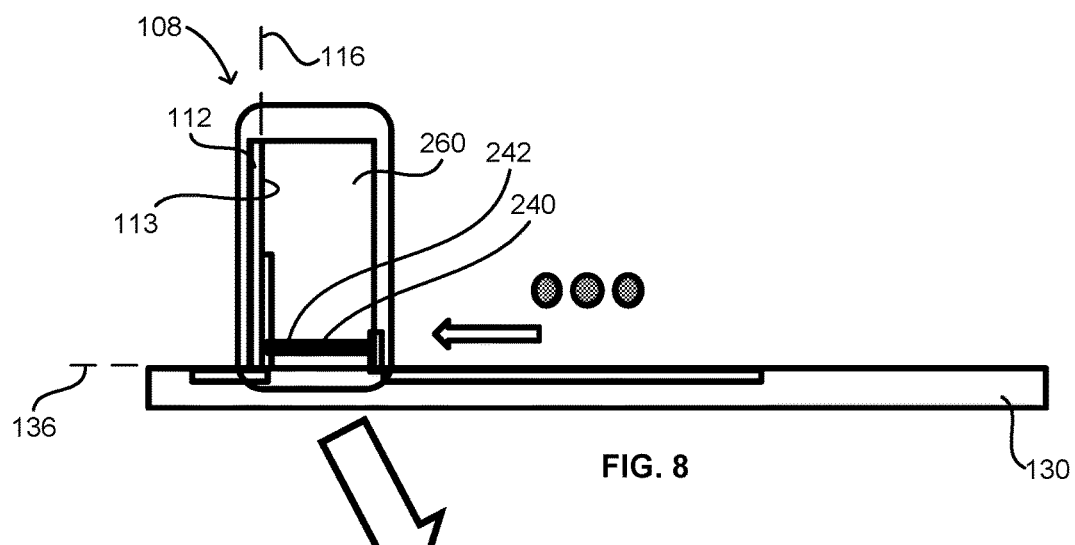
FIG. 8 is a side elevational view depicting a microelectronic unit in accordance with another embodiment disclosed herein.
Figure 9:
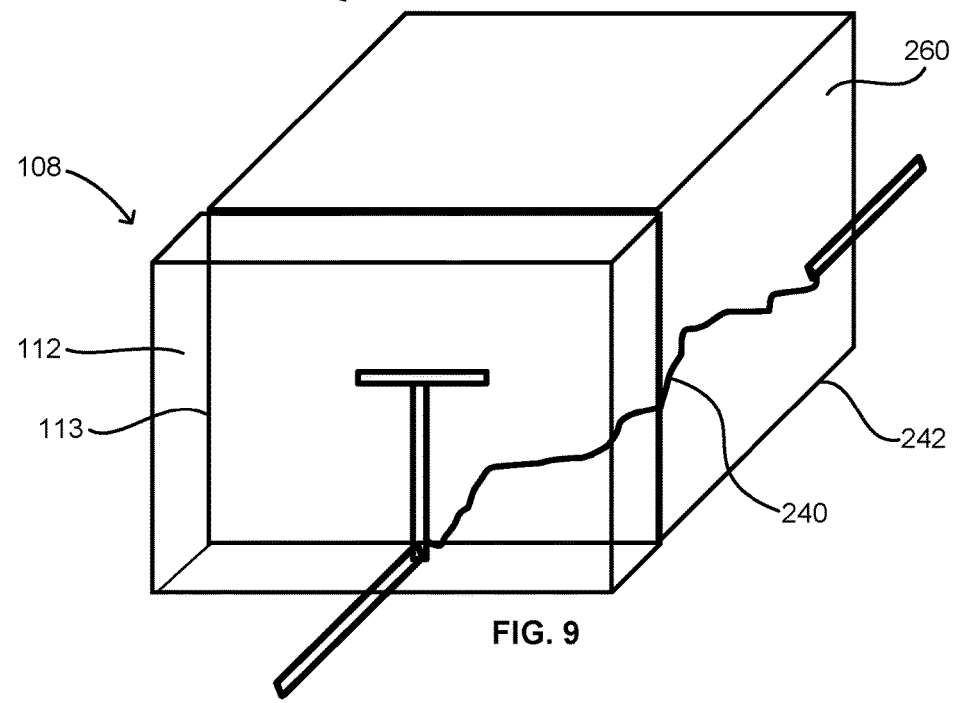
FIG. 9 is a perspective view further illustrating a portion of the microelectronic unit depicted in FIG. 8.

In a further variation, as seen in FIGS. 8 and 9, a delay element 240 can be supported on a supplementary element 260 adjacent to a front side of the microelectronic package 108. In this variation, the delay element 240 is shown extending in directions which are transverse to a plane 116 defined by a front surface 113 of the microelectronic element 112. For example, the delay element 240 may extend along and parallel to a surface 242 of the supplementary element 260 which faces the circuit panel 130. In a particular example, the delay element may overlie that surface 242. In another example, the delay element 240 may be fully or partially covered by material of the supplementary element 260, or it may extend through an interior of the supplementary element.

The same arrangement can also be provided for a microelectronic assembly per this variation in which a plurality of microelectronic packages 108 are provided. Alternatively, or in addition thereto, delay elements 140 may include electrical conductors which lie in a plane parallel to plane 116, and also include other out of plane electrical conductors which extend in directions transverse to such plane 116. In a particular embodiment, a delay element 140 may include an electrical conductor which extends parallel to plane 116 and other electrical conductor which extends parallel to plane 136.

Figure 10:
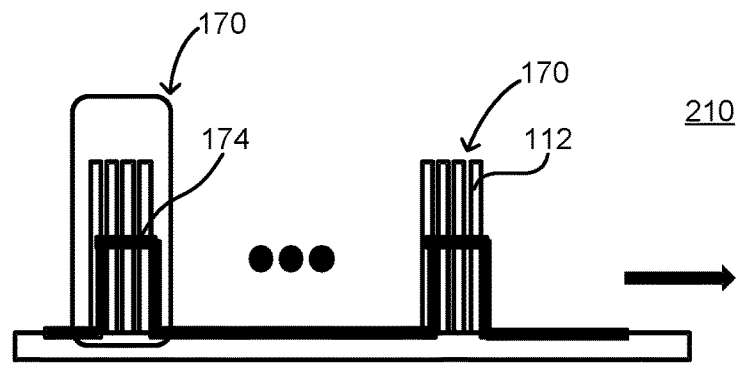
FIG. 10 is a side elevational view depicting a microelectronic unit in accordance with another embodiment disclosed herein.
Figure 11:
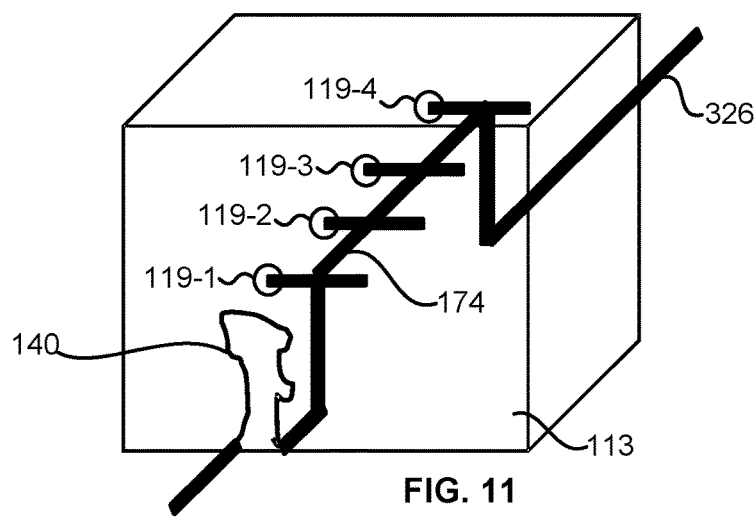
FIG. 11 is a perspective view further illustrating a portion of the microelectronic unit depicted in FIG. 10.
Figure 12:
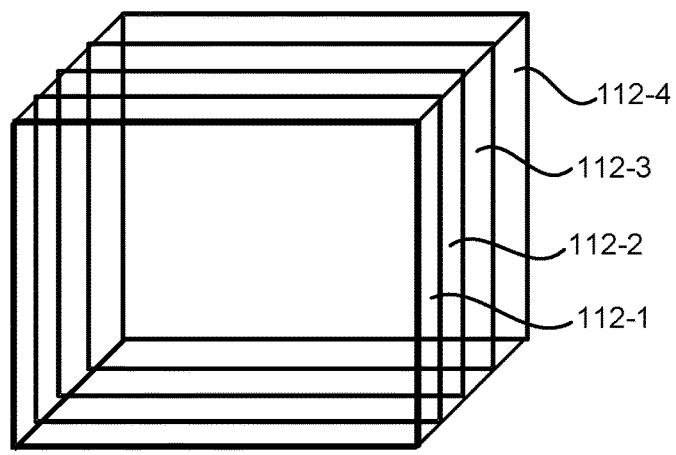
FIG. 12 is a perspective view further illustrating a portion of the microelectronic unit depicted in FIGS. 10 and 11.

In a further variation as seen in FIGS. 10, 11, and 12, a microelectronic unit comprises microelectronic elements arranged in a die stack package 170 of an assembly comprising a plurality of die stack packages 170. Individual microelectronic elements 112, i.e., microelectronic elements 112-1, 112-2, 112-3, and 112-1 of each die stack package are electrically connected with one another along a signaling path 326 of the common signaling bus by through vias 174 which extend through a thickness of microelectronic elements 112-1, 112-2 and 112-3. In this case, electrical connections between corresponding circuits of each microelectronic element can be made very short, such that signals traveling along the signaling path 326 of the bus reach each microelectronic element in the die stack at essentially the same time. As particularly seen in the schematic drawing of FIG. 11, the connection points 119-1, 119-2, 119-3, and 119-4 at which the signaling path 326 of the bus is coupled to the microelectronic elements 112-1, 112-2, 112-3, and 112-4, respectively, are coupled with one another by conductive structure including the through vias 174 which extend through a thickness of at least microelectronic elements 112-1, 112-2 and 112-3 in the illustrated example.

Also, as illustrated in this variation, a delay element 140 coupled to the signaling path can be provided at or overlying a front surface 113 of a first die 112-1 in the die stack package 170. In this way, as in the above-described examples, the total electrical lengths between connection regions at which each die stack package 170 is electrically coupled to a signaling path of the common signaling bus, can be lengthened and/or standardized to address the concerns described above. Delay elements 140 can alternatively be provided at a different location such as at the rear surface of a last die 112-4 in the die stack package, or delay elements can be provided at both the front and rear surfaces of a die in the die stack package. In another example, a delay element 140 can be provided on a supplementary element coupled with the die stack as in the case described in any of the cases contemplated above relative to FIGS. 6, 7, 8 and 9.

Although not specifically shown in the Figures or particularly described in the foregoing, elements in the various Figures and embodiments herein can be combined together in additional variations that are not inconsistent with the foregoing description. Each of the claims of this document constitutes a separate embodiment, and combinations of the claims herein and/or different embodiments herein are within the scope of this disclosure.

The invention claimed is:

1. A microelectronic assembly, comprising:
   a circuit panel having panel contacts at a major surface thereof, and electrically conductive elements configured to conduct signals of a common signaling bus, the electrically conductive elements coupled with respective sets of the panel contacts at respective first and second connection regions at the major surface; and
   a microelectronic unit comprising a plurality of microelectronic packages, each package having a surface and a plurality of terminals at the surface, the terminals of the respective package coupled with the respective set of panel contacts,
      each package comprising a microelectronic element having a front surface and element contacts at the front surface, each microelectronic element including a memory storage array, wherein the front surface of the microelectronic element is disposed at a substantial angle relative to a plane defined by the major surface of the circuit panel; and
   the at least one microelectronic unit further comprising a plurality of delay elements thereon, each delay element electrically coupled with a signaling path of the common signaling bus extending on the microelectronic unit between a first terminal of a first package coupled to a panel contact at the first connection region, and a second terminal of the microelectronic unit coupled to a panel contact at the second connection region, the signaling path electrically coupled to the microelectronic element of the first package between the first terminal and the second terminal, whereby each delay element is configured to increase a total electrical length along the signaling path between the first connection region and a connection region at which a package adjacent to the first package is electrically coupled.

2. The microelectronic assembly of claim 1, wherein a pitch between the first planes defined by the front surfaces of adjacent microelectronic packages is smaller than a width dimension of the microelectronic packages in a direction parallel to the first planes.

3. The microelectronic assembly of claim 1, wherein the delay elements comprise electrical conductors extending in directions of a plane.

4. The microelectronic assembly of claim 3, wherein the electrical conductors extend along at least one of the front or rear surfaces of at least one of the plurality of microelectronic elements.

5. The microelectronic assembly of claim 4, wherein the electrical conductors extend along the rear surface of the microelectronic element.

6. The microelectronic assembly of claim 5, wherein the electrical conductors extend on the first package.

7. The microelectronic assembly of claim 1, wherein the delay elements comprise electrical conductors extending in directions transverse to the first planes.

8. The microelectronic assembly of claim 3, wherein the electrical conductors are supported on a supplementary element and are electrically coupled to the second connection region.

9. The microelectronic assembly of claim 8, wherein the supplementary element is disposed between adjacent ones of the microelectronic packages.

10. The microelectronic assembly of claim 8, wherein the supplementary element is disposed between adjacent ones of the microelectronic elements within one of the at least one microelectronic package.

11. The microelectronic assembly of claim 8, wherein the microelectronic unit includes a plurality of microelectronic packages, wherein the supplementary element is disposed between first and second adjacent microelectronic packages of the plurality of microelectronic packages.

12. The microelectronic assembly of claim 3, wherein the plurality of microelectronic elements includes a set of microelectronic elements in which the set includes through vias extending in directions transverse to said set of planes, wherein at least some of the plurality of microelectronic elements of the set have element contacts electrically coupled to one another and to the delay elements by way of the through vias.

13. The microelectronic assembly of claim 8, wherein the supplementary element has a surface extending parallel to said second plane, wherein the electrical conductors extend in at least one direction substantially parallel to the second plane.

14. A microelectronic unit, comprising:
   a plurality of microelectronic elements each having a front surface, and element contacts at the front surface, each microelectronic element including a memory storage array;
   first terminals and second terminals at an exterior surface of the microelectronic unit, the first terminals and the second terminals configured for connection with corresponding first and second sets of panel contacts at first and second connection regions of a circuit panel, respectively, the first and second sets of panel contacts coupled with the conductors of a common signaling bus extending along the circuit panel, wherein the front surfaces of the first and second microelectronic elements define a plurality of first planes which are non-parallel with a second plane defined by the major surface of the circuit panel; and a plurality of delay elements on the microelectronic unit each delay element electrically coupled with a signaling path of the common signaling bus between one of the first terminals and a corresponding second terminal of the plurality of second terminals, the signaling path coupled to a contact of at least one microelectronic element between the first terminal and the corresponding second terminal, each delay element configured to increase a total electrical length along the signaling path between the first terminal and the corresponding second terminal.

15. The microelectronic unit of claim 14, wherein a pitch between the front surfaces of adjacent microelectronic elements of the plurality of microelectronic elements is smaller than a width dimension of a microelectronic package in a direction parallel to the first planes.

16. The microelectronic unit of claim 14, wherein the delay elements comprise electrical conductors extending substantially in directions of a plane parallel to the first planes.

17. The microelectronic unit of claim 16, wherein the microelectronic elements have rear surfaces remote from their respective front surfaces, and the electrical conductors extend in directions of a plane parallel to the rear surface of at least one of the plurality of microelectronic elements.

18. The microelectronic unit of claim 14, wherein the delay elements comprise electrical conductors supported on a supplementary element.

19. The microelectronic unit of claim 18, wherein the microelectronic elements are packaged in a plurality of microelectronic packages of the microelectronic unit, wherein the supplementary element is disposed between adjacent ones of the microelectronic packages.

20. The microelectronic unit of claim 18, wherein the microelectronic elements are packaged in at least one microelectronic package, wherein the supplementary element is disposed between adjacent ones of a plurality of the microelectronic elements within a microelectronic package of the microelectronic unit.

21. The microelectronic unit of claim 14, wherein the plurality of microelectronic elements includes a set of microelectronic elements in which the set includes through vias extending in directions transverse to said first planes, wherein at least some of the plurality of microelectronic elements of the set have element contacts electrically coupled to one another and to the delay elements by way of the through vias.

22. The microelectronic unit of claim 18, wherein the delay elements comprise electrical conductors extending in directions transverse to the first planes.

23. The microelectronic unit of claim 18, wherein the delay elements comprise at least one set of second electrical conductors extending on the microelectronic unit in directions substantially parallel to the major surface of the circuit panel, wherein the first connection region and the second connection region are electrically coupled through the at least one set of second conductors.

* * * * *